United States Patent [19]
Feldman et al.

[11] Patent Number: 5,771,218
[45] Date of Patent: Jun. 23, 1998

[54] PASSIVELY ALIGNED INTEGRATED OPTICAL HEAD INCLUDING LIGHT SOURCE, DETECTOR, AND OPTICAL ELEMENT AND METHODS OF FORMING SAME

[75] Inventors: Michael R. Feldman; Alan D. Kathman, both of Charlotte, N.C.

[73] Assignee: Digital Optics Corporation, Charlotte, N.C.

[21] Appl. No.: 727,837

[22] Filed: Sep. 27, 1996

[51] Int. Cl.⁶ .................................................. G11B 7/00
[52] U.S. Cl. ...................... 369/112; 369/44.12; 369/122; 257/98
[58] Field of Search .................................. 369/112, 122, 369/103, 44.12, 109; 385/14, 37, 91, 88, 89; 257/98

[56] References Cited

U.S. PATENT DOCUMENTS

| | | | |
|---|---|---|---|
| 4,626,103 | 12/1986 | Feldman et al. | 356/363 |
| 4,636,080 | 1/1987 | Feldman | 356/401 |
| 4,866,694 | 9/1989 | Korth | 369/112 |
| 5,025,165 | 6/1991 | Chen et al. | 250/491.1 |
| 5,159,473 | 10/1992 | Feldman | 359/11 |
| 5,168,324 | 12/1992 | Hackel et al. | 356/346 |
| 5,170,269 | 12/1992 | Lin et al. | 359/9 |
| 5,189,485 | 2/1993 | Hackel et al. | 356/320 |
| 5,202,775 | 4/1993 | Feldman et al. | 359/11 |
| 5,204,516 | 4/1993 | Opheij | 369/44.12 |
| 5,229,883 | 7/1993 | Jackson et al. | 359/569 |
| 5,237,434 | 8/1993 | Feldman et al. | 359/19 |
| 5,309,282 | 5/1994 | Feldman et al. | 359/641 |
| 5,337,398 | 8/1994 | Benzoni et al. | 385/90 |
| 5,446,814 | 8/1995 | Kuo et al. | 385/31 |
| 5,499,312 | 3/1996 | Hahn et al. | 385/91 |
| 5,583,843 | 12/1996 | Horinouchi | 369/103 |
| 5,608,233 | 3/1997 | Sahara et al. | 369/122 |
| 5,621,715 | 4/1997 | Ohyama | 369/122 |
| 5,638,469 | 6/1997 | Feldman et al. | 385/14 |

OTHER PUBLICATIONS

"Holographic Optical Head for Compact Disk Applications" Wai–Hon Lee, Pencom International Corporation, Jun. 1989/vol. 28, No. 6.

Primary Examiner—Tod R. Swann
Assistant Examiner—Kim-Kwok Chu
Attorney, Agent, or Firm—Allen, Dyer, Doppelt, Milbrath & Gilchrist, P.A.

[57] ABSTRACT

An integrated optical head, such as, for a disk drive, preferably includes an optically transparent substrate. The substrate has a diffractive optical element formed on one face and a plurality of electrical contact pads exposed on the other face. A light source is positioned to emit light through the substrate, through the diffractive optical element, and toward data storage media. The light source includes a plurality of electrical contact pads corresponding to the plurality of electrical contact pads exposed on the face of the substrate. An optical detector is positioned to detect light reflected from the data storage media, through the diffractive optical element, and through the substrate. The optical detector includes a plurality of exposed electrical contact pads corresponding to the plurality of electrical contact pads exposed on the face of the substrate. The substrate and the light source and optical detector are passively aligned using solder bumps between pairs of contact pads. A mechanical passive alignment arrangement is also disclosed.

64 Claims, 8 Drawing Sheets

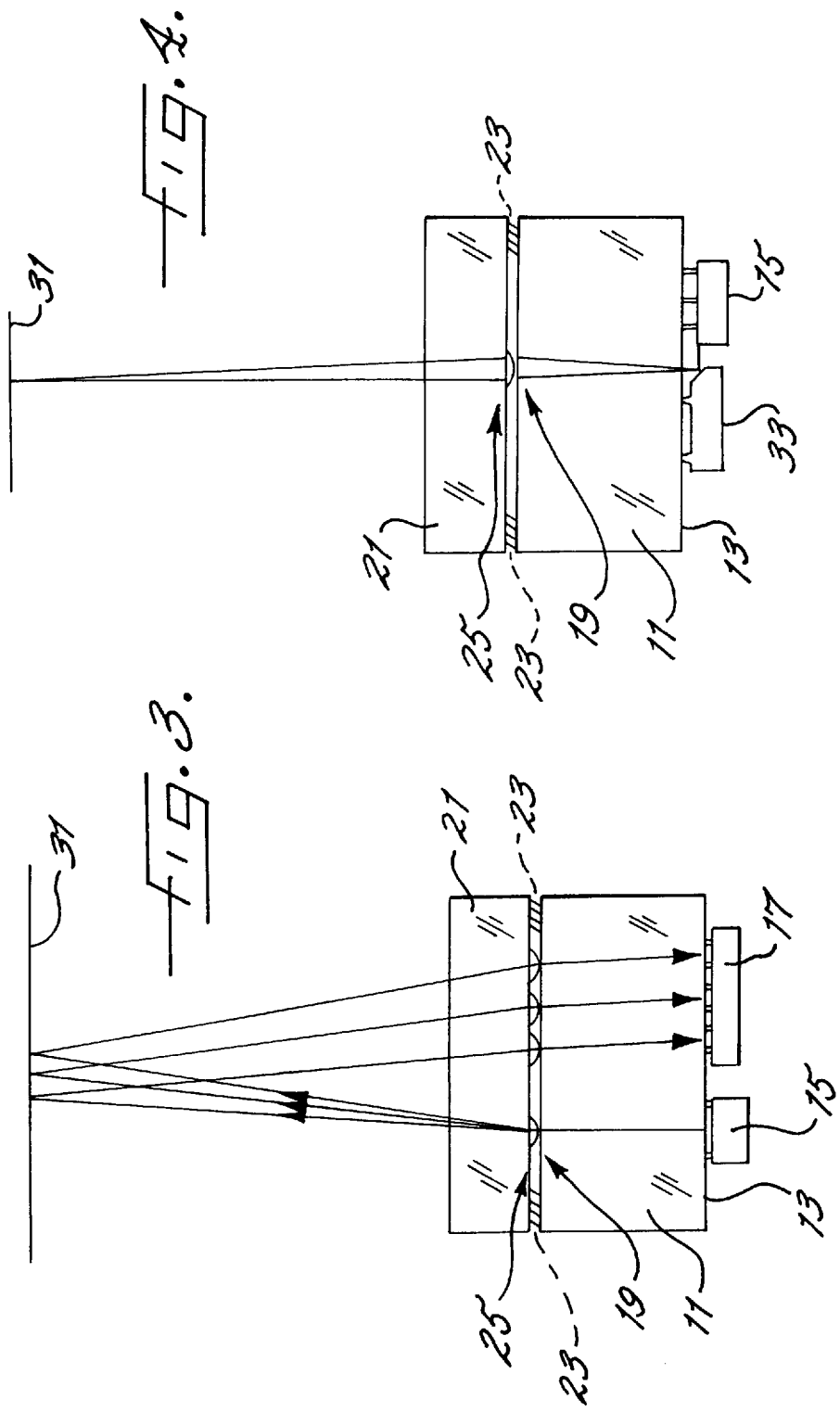

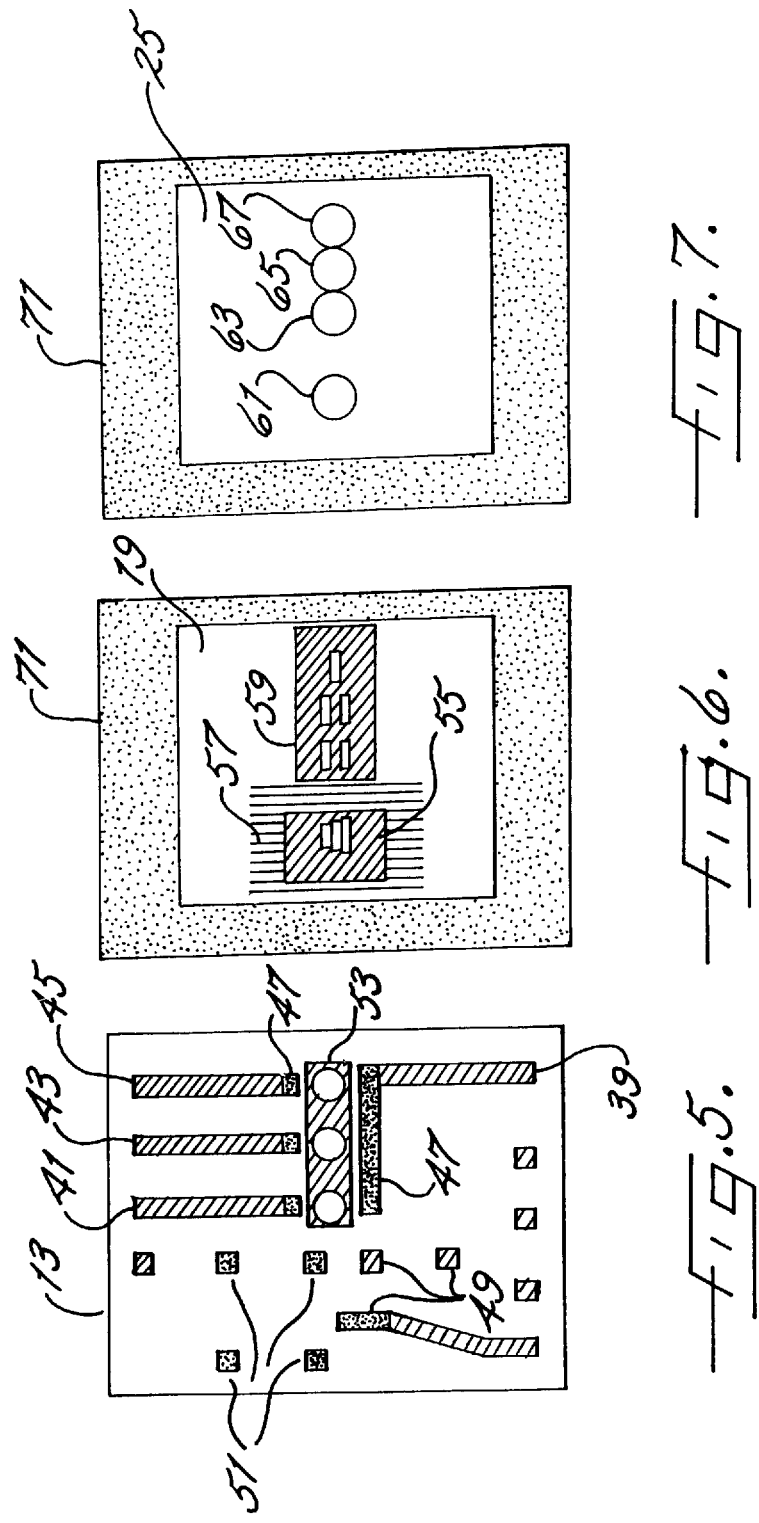

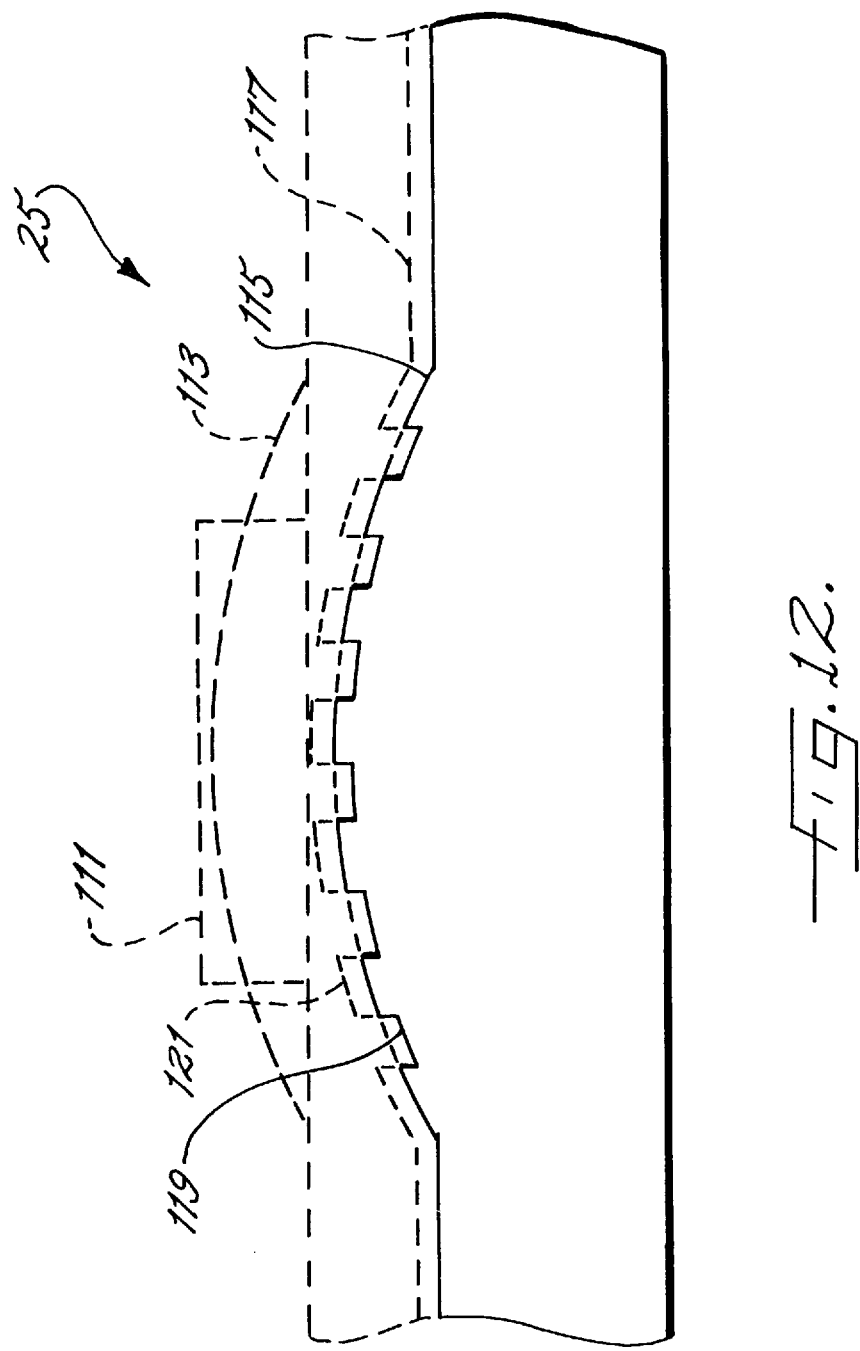

PASSIVELY ALIGNED INTEGRATED OPTICAL HEAD INCLUDING LIGHT SOURCE, DETECTOR, AND OPTICAL ELEMENT AND METHODS OF FORMING SAME

FIELD OF THE INVENTION

The present invention relates to the field of optics and, more particularly, to an integrated optical head, such as for use in a disk drive.

BACKGROUND OF THE INVENTION

Many typical computer systems include a disk drive cooperating with storage media to permit storage and retrieval of data. A typical optical disk drive includes an optical head that conventionally uses a laser to transmit light to the optical disk. Light reflected from the surface of the disk is detected by an optical detector and processed to read data from the disk. An example of such an optical head is disclosed, for example, in U.S. Pat. No. 5,204,516 titled "*Planar Optical Scanning Head Having Deficiency-Correcting Grating*" by Opheij. The size of the various optical head components, however, are often too large for many desired applications and many market demands. Also, as densities of integrated circuits and system boards increase, the demand for smaller components increases. Additionally, the production process for a conventional optical head requires that the laser be excited or turned-on (i.e., "active alignment") for alignment of the laser, the detector, and the optical elements. An example of active alignment processes is illustrated and described in an article published in Optical Engineering (June 1989) titled "*Holographic Optical Head For Compact Disk Applications*" by Lee.

Unfortunately, these active alignment requirements are complex, time consuming, and relatively expensive. Further, the level of size reduction in the vertical direction of an optical head is limited. In addition, the relatively large size of the elements of an optical head which can be manipulated is determined by the need for active alignment.

SUMMARY OF THE INVENTION

With the foregoing background in mind, it is therefore an object of the present invention to provide an optical head, such as for a disk drive, and related methods which is more compact and less expensive to manufacture.

This and other objects, advantages, and features of the present invention are provided by an integrated optical head that relies on passive alignment of the various components. The integrated optical head preferably includes an optically transparent substrate having first and second faces.

The substrate may include a diffractive optical element formed on the second face of the substrate. An optical light source, such as a laser, is positioned adjacent the first face of the substrate to transmit light through the substrate, through the diffractive optical element, and toward a target, such as optical storage media. An optical detector is positioned adjacent the first surface of the substrate to detect light reflected from the storage media, through the diffractive optical element, and through the substrate. Passive alignment means is positioned between the first surface of the substrate and at least one of the laser and the optical detector for passively aligning the laser or the optical detector with respect to the substrate. Accordingly, the laser and detector may also be aligned with the optical elements on the second surface of the substrate.

An optical head according to the present invention may provide a size reduction of more than three times compared to the prior art, in part, based upon photolithographically shaped and placed refractive optical elements, as well as diffractive optical elements. Further, the laser and detector are preferably also accurately and passively aligned by means of photolithography. More particularly, in one embodiment, passive alignment is achieved by the wetted area and volume of solder in opposing alignment areas provided by contact pads.

In another embodiment, a second transparent substrate is aligned and joined to the first substrate.

The second substrate may carry one or more optical elements. According to this aspect of the invention, alignment areas in the form of benches or other mechanical features may be formed in one surface and mating recesses, for example, may be formed in the other surface. Adhesive attachment areas, which may overlap the alignment areas, hold the substrates together. Alignment may also be accomplished at the wafer level by having the elements of each die accurately placed using photolithography to accurately align the two wafers. The assembled dies can then be diced without the individual alignment means or steps being required for connecting the first and second substrates.

Methods of forming an optical head are also provided according to the present invention. A method of forming an optical head preferably includes forming at least one optical element on a first face of a transparent substrate and positioning a laser adjacent the first face of the substrate so as to emit light through the substrate, through the at least one optical element, and toward the data storage media. An optical detector preferably is positioned adjacent the first face of the transparent substrate adjacent the laser to detect light reflected from the data storage media, through the substrate, and to the optical detector.

The laser, the optical detector, and/or the at least one optical element on the substrate may passively aligned using either the contact pads and solder bumps, or the mechanical alignment as discussed above.

An integrated optical head and the related methods according to the present invention advantageously provide a significantly smaller optical head for fabrication without the need for exciting or turning on the laser light source to actively align the components. The integrated optical head according to the present invention overcomes the disadvantages of the prior art so that the wavelength of the laser is left as the predominant limiting factor in size reduction instead of other considerations.

BRIEF DESCRIPTION OF THE DRAWINGS

Some of the objects and advantages of the present invention having been stated, others will become apparent as the description proceeds when taken in conjunction with the accompanying drawings in which:

FIG. 3 is a side elevational view of an integrated optical head according to the present invention;

FIG. 4 is side elevational view of the integrated optical head as shown in FIG. 3 rotated ninety degrees.

FIG. 5 is a plan view of the component side of a first transparent substrate of an integrated optical head according to the present invention;

FIG. 6 is a plan view of a holographic optical element of a first transparent substrate of an integrated optical head according to the present invention;

FIG. 7 is a plan view of a refractive lens surface of a second transparent substrate of an integrated optical head according to the present invention;

FIG. 12 is a vertical sectional view of a substrate showing a method of creating a hybrid microlens for an integrated optical head according to the invention.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the illustrated embodiments set forth herein. Rather, these illustrated embodiments are provided so that this disclosure will be thorough and complete, and will fully convey the scope of the invention to those skilled in the art. Like numbers refer to like elements throughout, and prime and double prime notation are used to indicate similar elements in alternative embodiments.

Figure 1:
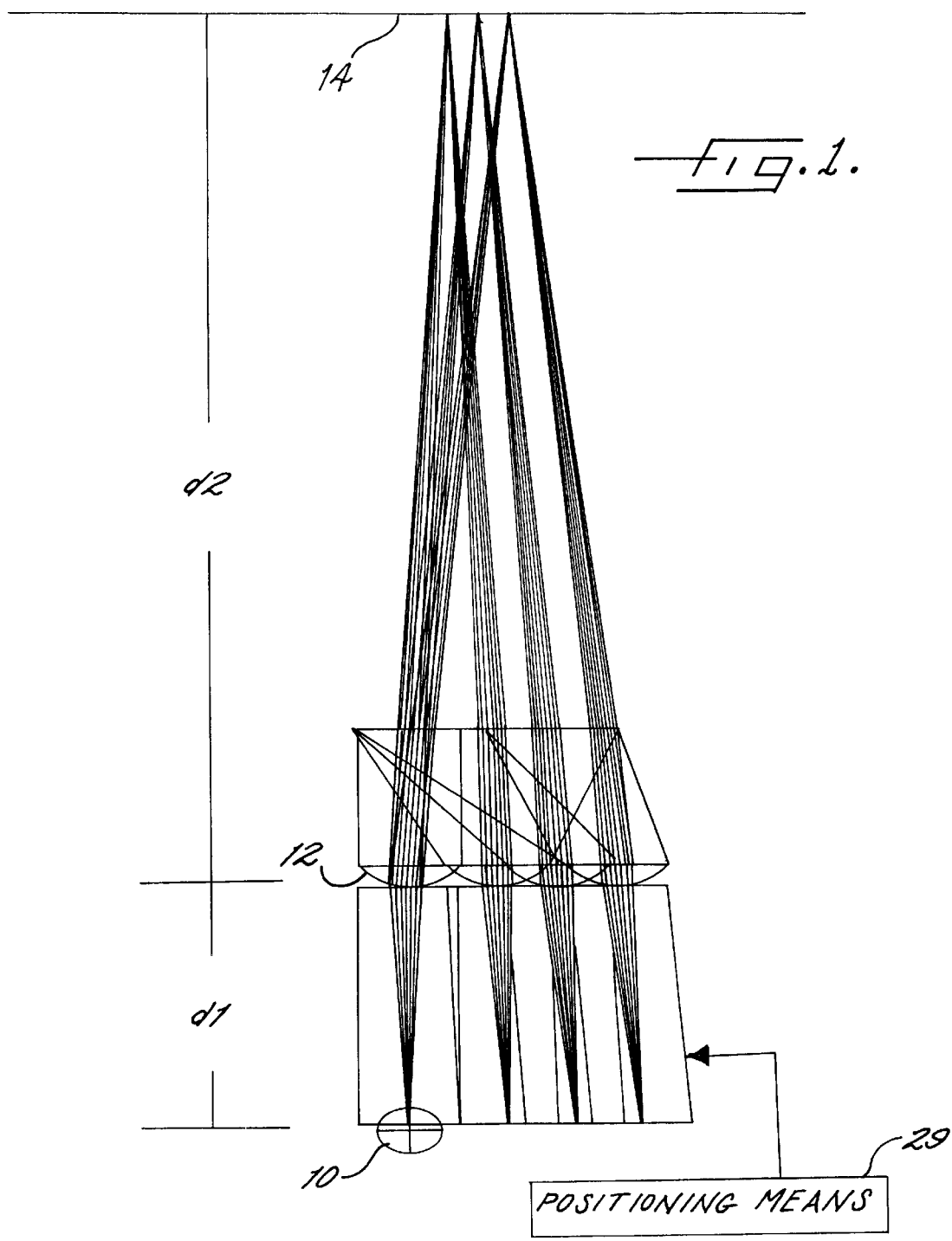
FIG. 1 is a schematic view of an integrated optical head according to the present invention.

FIG. 1 is an optical design schematic of an assembly according to the invention for use in detecting an optical track on a storage media. A light source 10 directs coherent light, with a dispersion angle of fifteen degrees, upward through an object distance d1 through a diffractive element (DOE) not shown and to a refractive lens 12. The DOE divides the light into a number of beams, only three of which are shown as a plurality of rays in FIG. 1. The beams are focused on surface 14 located at image distance d2 from the lens 12. The spot size and spacing of the light on the image surface 14 determines the tracking accuracy and therefore the amount of information that can be stored on the media. The size to which the spot can be reduced is in the instant design, approximately 0.020 mm. In the design of FIG. 1, the refractive lens 12 must have a significant curvature in order to focus the light to 0.020 mm spots on the media. The spots of light are spaced approximately 0.100 mm from each other on the media to limit crosstalk noise. As would be readily understood by those skilled in the art the optical head can be positioned by the illustrated positioning means 29.

If a design were attempted using a single lens as taught in the prior art, the lens curvature required to focus the laser light to 0.020 mm spots in this compact architecture would control the dimensions of the single lens. Thus the use of a single lens as taught in the prior art for reducing the size of optical heads, is a limiting factor in size reduction of the entire optical head assembly. This factor is one of the reasons that multiple lenses are employed in the instant invention instead of a single lens.

The distance d1 is used to advantage to provide an adequately wide beam at the DOE as shown later with respect to FIG. 7. The distance d2 is chosen to achieve adequate spot size modulation depth and depth of focus at the media surface.

The ratio of the distances d1/d2 determines the amount of demagnification of the image reflected from the media that occurs in a lens. In a single lens design, this demagnification affects not only spot size but spot spacing. A demagnification of ¼ gives a spot size of 0.005 mm which because of aberration is spread to an area 0.025 mm. If a single lens design had been used, the spacing of the spots would also have been demagnified to 0.025 mm and significant crosstalk noise would result. By using individual lenses, spaced approximately 0.200 mm, the detectors can be spaced at about 0.220 mm and thereby eliminate crosstalk noise using the 0.025 mm light spots.

Figure 2:
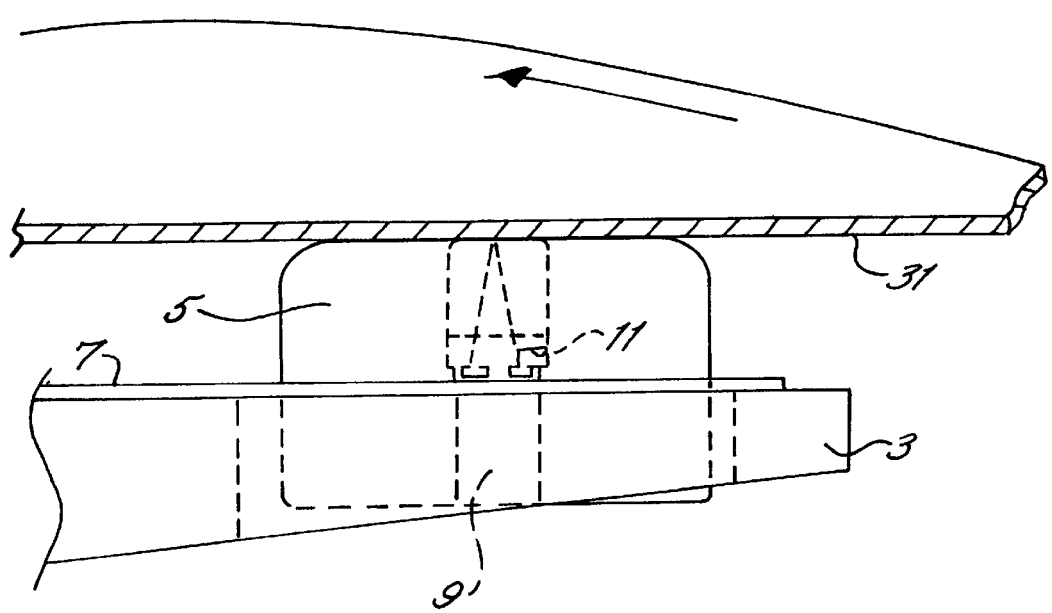
FIG. 2 is a fragmentary side perspective view of an integrated optical head according to the present invention.

FIG. 2 is a side view of a magnetic floppy disk head 5 with an optical tracking assembly according to a preferred embodiment of the invention. Head 5 is mounted, in arm 3 by known means not shown, for the extension across the various tracks of media 31. Head 5 is electrically connected to read and write circuits and tracing control circuits by a flexible printed circuit 7. A recess 9 of approximately two millimeters by one point six millimeters and four and a half or five millimeters deep is provided in head 5 in which the optical assembly comprising substrate 11 is mounted and connected to flexible printed circuit 7. It will be appreciated that the same assembly techniques and methods of the invention may be used to assemble optical disk read heads, as well as magnetic disk heads with optical tracking.

Referring now to FIG. 3, a first transparent substrate 11 comprising fused silica or other optical material has component mounting metalized pads or contact pads placed on its bottom surface 13, such as using substrate fiducial marks or indicia and accurately aligned photolithographic masks and metal deposition steps known in the art of microelectronic circuit manufacture. In this preferred embodiment, surface 13 of substrate 11 is approximately 1.6 mm by 2 mm and the substrate 11 is approximately 0.8 mm thick. A laser chip 15 is mounted to the surface 13 by means of some of the mentioned metalized pads. As shown in FIG. 4, laser 15 is an edge emitting laser with the laser light directed upwards through means of a precision mirror 33 as shown in FIG. 4. It will by understood that the edge emitting laser 15 can be replaced with a vertical cavity surface emitting laser and thereby obviate the need for the precision mirror in order to direct the laser beam normal to the substrate surface.

An optical detector chip 17 is also mounted to the component surface of substrate 11 by means of the metalized pads. A hologram surface 19 on the opposite side of substrate 11 carries the diffractive optical elements shown in detail in FIG. 7. The diffractive optical element phase profiles are designed using the computer calculations and manufactured using techniques taught by Swanson et al. in U.S. Pat. No. 5,161,059, the entire disclosure of which is incorporated herein by reference.

The optical elements are created photolithographically using the same fiducial marks or indicia used to place the metalized pads. Alternately second fiducial marks that have been aligned with the first marks may be used to align the masks that are also used to create the optical elements. In this way, when the light source, mirror and detector are mounted on their metalized pads, the optical paths among the devices and through the optical elements are in optical alignment as shown more clearly in FIGS. 3 and 4. The precision mirror, if needed for redirecting light from an edge emitting laser, is considered to be a device for the purposes of this description only because of the way it is mounted using metalized pads and solder as a silicon chip would be mounted. The hologram surface 19 also has the attachment areas 23 that attach the first transparent substrate 11 with a second transparent substrate 21. These attachment areas and later described alignment areas are shown in detail in FIGS. 11 and 12.

The second substrate 21 carries the refractive optics in a surface 25 that provides the second lens of lens pairs or doublets. Light from laser 15 is shaped and split by a diffractive optical element in hologram surface 19 into five separate beams of light that are directed through substrate and travel approximately 2.4 mm to the media. Only the chief ray of each beam is shown in FIG. 3 for clarity of the description. One beam is used for intensity feedback to control the electrical power to laser 15. The other four beams are used for media position or tracking detection. The beams of coherent light are reflected from media 31 and return through second substrate 21 and first substrate 11 to be detected by detector 17. Since the elements are all in their designed optical alignment by virtue of the placement of the metalization pads, there is no need to energize the laser and move the elements relative to each other to bring them into optical alignment. In other words, passive alignment is used rather than the active alignment requiring operation of the laser as in the prior art. It will be recognized that although the beams preferably pass first through the diffractive optical element in surface 19, the order of the optical elements in the light path could be changed or the elements could be combined into one more complex element without departing from the scope of the invention.

FIG. 4 is another side view of the assembly of FIG. 3. As shown in FIG. 4, the light emitted by edge emitting laser 15 comes out substantially parallel to the plane of component surface 13 and must be directed normal to the component surface by the 45 degree surface of mirror 33. The light can then pass through substrate 11, a diffractive optical element in surface 19, a refractive lens 61 in surface 25, substrate 21 and be reflected from media 31 as shown in FIGS. 1 and 3.

FIG. 5 is a plan top view of the component surface 13 looking down through transparent substrate 11. Electrical contact metalizations 39, 41, 43 and 45 provide electrical connections to detecting photo-diodes in detector 17. Centered under detector 17 is a metalized area 53 having three apertures through which light reflected from media 31 is received. Solder ball alignment areas 47 on each side of area 53 serve both as electrical contacts and as alignment mechanisms in this embodiment. The areas 49 are also solder ball pads and serve to align and connect the laser 15 to the first substrate and provide current to laser 15. Areas 51 on the other hand only provide mechanical alignment and mechanical attachment of mirror 33 to first transparent substrate 11.

The hologram surface 19 appears in FIG. 6 in plan view, again looking down onto substrate 11. Hologram surface 19 has metalized area 55 which acts as a mask to reduce stray light but allow three beams created by diffractive optics from the light from laser 15 to be directed to media 31 from which they are reflected to reach detector 17 through the five apertures shown in metalized areas 59. Surrounding metalized area 55 is a diffraction grating 57 that scatters stray light from laser 15 so that it does not adversely affect detector 17.

FIG. 7 shows the refractive lens surface 25, again in plan view looking down, this time through substrate 21. Lens 61 in combination with the diffractive optical elements in mask 55 shape and focus the laser light into three spots of approximately 20 $\mu$m diameter and spaced at approximately 100 $\mu$m onto media 31. Lenses 63 and 65 focus the light reflected from media 31 through mask 59 to detector 17 for position control and/or reading. Lens 67 focuses reflected light to the photo-diode of detector 17 that provides an intensity level signal to the power control circuits which control the electrical power provided to laser 15.

Surrounding both surface 19 and surface 25 is an attachment area shown generally as area 71 in FIGS. 6 and 7. Area 71 contains spacing stand off benches and is the area in which an adhesive is placed in order to join substrate 21. The standoff benches passively define a proper or desired vertical spacing or alignment. Preferably the adhesive is ultraviolet light cured adhesive that can be laid down without concern for time to harden. The adhesive is placed in areas 71 and then after the substrates 11 and 21 are aligned, the assembly is flooded with ultra-violet light to catalyze the adhesive.

In an alternate embodiment, the adhesive is replaced with photolithographically placed metalization pads and the two substrates are joined using solder ball technology.

Figure 8:
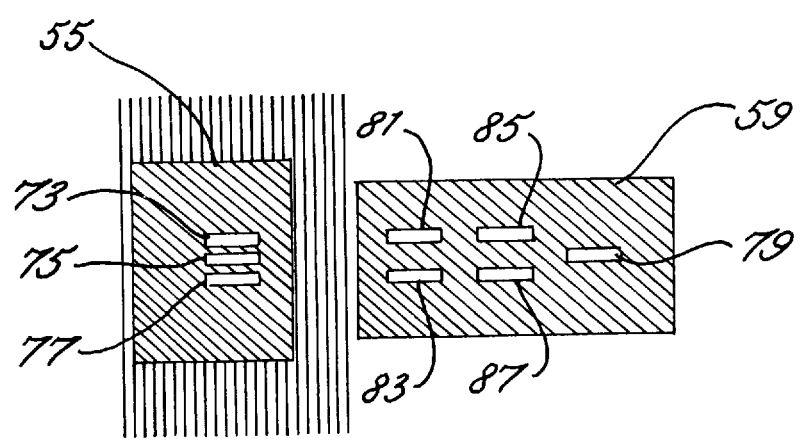
FIG. 8 is a plan view of diffractive optical elements of an integrated optical head according to the present invention.

FIG. 8 shows three diffractive optical elements 73, 75 with mask 55. These three elements provide the five beams of light to be reflected from the media, the three main rays of which are shown in FIG. 3. Element 75 provides the power control beam that is reflected from the media and is received at aperture 79 in mask 59 as shown in FIG. 8. Elements 73 and 77 each provide two beams that interfere at the media surface to create a dark band with two light bands on either side of the dark bands. The light bands are reflected back down to the pairs of apertures 81, 83 and 85, 87 shown in FIG. 8 to provide the varying light intensity that is used to detect an optical track on the media. The apertures 73, 75 and 77 containing diffractive elements are each approximately 100 $\mu$m long and 20 $\mu$m wide.

Figure 9:
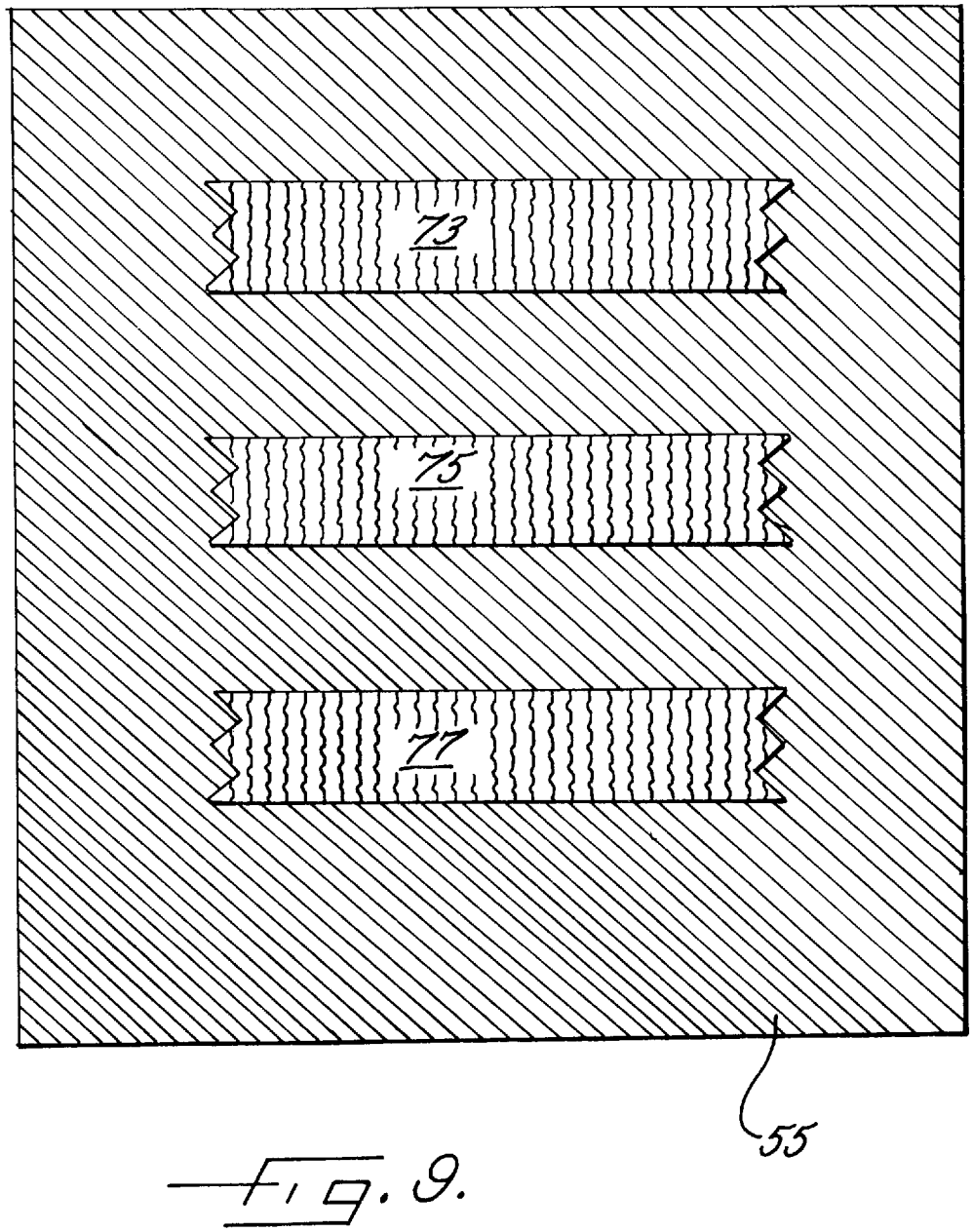
FIG. 9 is an enlarged view of mask portions of FIG. 4 according to the present invention.

Referring now to FIG. 9, the apertures of FIG. 8 are shown enlarged. The ends of each aperture 73, 75 and 77 are provided with an irregular boundary that change the orientation of the interference fringes so that they are not parallel with the optical track being detected and accuracy is improved.

Figure 10:
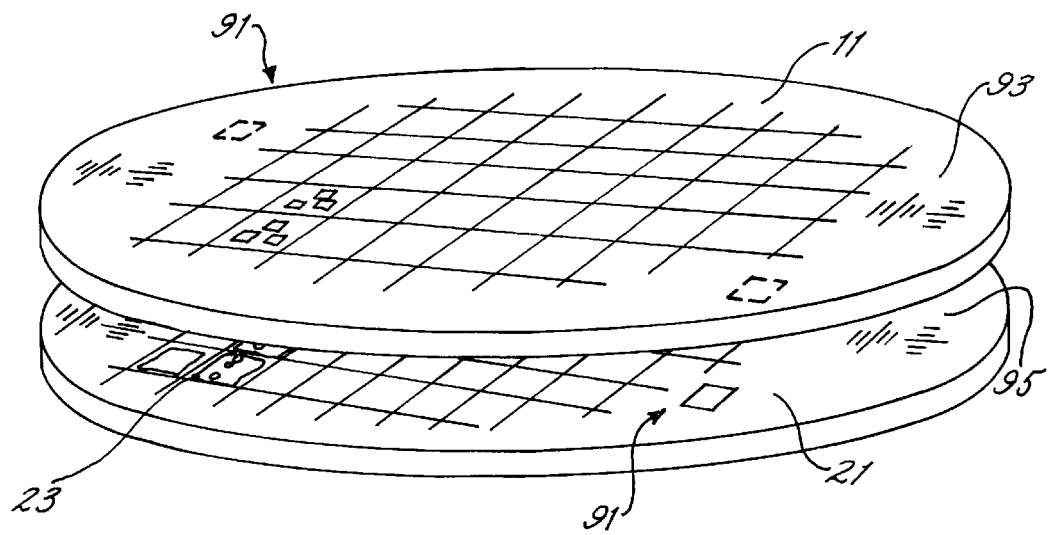
FIG. 10 is a perspective view showing an article including two wafers according to the present invention.

FIG. 10 shows the two substrates 11 and 21 prior to their being assembled into optical assemblies and diced. Because each element has been accurately placed on each substrate using photolithography, the entire wafers can be aligned and joined prior to being diced into chips without the need to energize any of the laser devices on the substrate 11. FIG. 10 shows the substrates inverted from the way they are shown in FIGS. 2, 3 and 4 in order to show the lasers, mirrors and detectors in place on top of each die.

Prior to putting the wafers together, the adhesive material 23 is placed in the area 71 of each die on at least one of the wafers. After the adhesive is placed, the two wafers are placed one above the other and aligned. In one embodiment of the invention, a known photolithographic mask aligning tool is used with vernier fiduciary marks 93 and 95 to monitor the relative displacement of the two substrates until they are in alignment with each other. The substrate 11 can then be lowered onto substrate 21, the alignment rechecked, and the adhesive catalyzed by ultraviolet light.

In another embodiment, the two wafers are passively aligned using the alignment means 91. Three forms of alignment means are contemplated and shown in FIGS. 11A, 11B and 11C. One, shown in FIG. 11A, takes the form of V-shaped grooves 97 etched into matching faces of the substrates 11 and 21. These grooves are then aligned with sphere 99 to index the two wafers into alignment. Note that only a few grooves and spheres are needed to align all of the dies while they are still together as a wafer. Another embodiment of the alignment means, shown in FIG. 11B, comprises photolithographically placed metalization pads 101 which are then connected by reflowing a solder ball 103. In a still further embodiment of FIG. 1C, a bench 105 is raised by etching the surrounding surface and the bench 105 is indexed into a recess 107, also created by photolithographically placed etchant, preferably reactive ion etchant.

In the adhesive area 71 of each die, means may be needed to accurately space the two substrates from each other. Spacing is accomplished in one embodiment by means of a bench 109 shown in FIG. 1D. Three or more benches 109 are located in the area 71 around each die in an adhesive with high compressive.

Figures 11A, 11B, 11C, 11D:
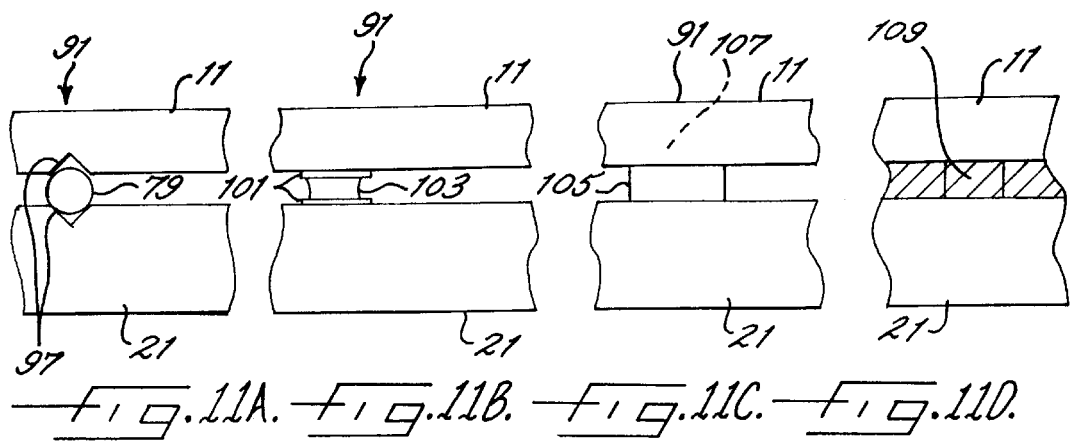
FIGS. 11A–11D are vertical fragmentary sectional views of example alignment features according to the present invention.

In another embodiment, the solder bumps or balls and metalizations are used in area 23 accomplishing both attachment and alignment as shown in FIG. 11B. Alternately, when an adhesive with high compressive strength is chosen, only three or more such benches are needed for spacing the entire wafers and after the adhesive has set, the joined wafers can be diced without substrate spacing.

Referring now to FIG. 12, a method of photolithographically placing an optical element on a substrate surface 25 in alignment with diffractive elements and/or electrical devices is shown. A refractive optical element in the form of a microlens 115 is formed by placing a circular layer of photoresist 111 on a surface of optical material using a mask. The photoresist is then partially flowed using controlled heat so that the photoresist assumes a partially spherical shape 113. Thereafter, the surface 25 is etched and a refractive element 115 having substantially the same shape as the photoresist 113 is formed by the variable etch rate of the continuously varying thickness of the photoresist 113. In the event that a hybrid optical element is desired, the microlens 115 is further processed by etching or embossing steps.

In one embodiment, a layer of photoresist 117 is placed over the microlens 115 and exposed through a photolithographic mask with the phase pattern of a diffractive optical element. When the exposed photoresist is then developed, the surface of the microlens can be further etched with the diffractive optical element pattern to produce a hybrid optical element 119. In another embodiment, a polymer is placed over the microlens in place of the photoresist and the phase pattern is embossed into the polymer as shown at 121. It also will be understood that although a convex element has been shown, the same technique can be used to create a concave microlens.

Having described the invention in terms of preferred embodiments thereof, it will be recognized by those skilled in the art of optical system design that various further changes in the structure and detail of the implementations described can be made without departing from the spirit and scope of the invention. By way of example, the diffractive optical elements may be placed on the same surface of a substrate on which the electronic components are accurately placed with these diffractive optical elements using photolithography. Likewise refractive optical elements may be placed using photolithography in alignment on the other surface of the same substrate thereby allowing an entire optical assembly to be fabricated using but one substrate without the need for actively energizing a light source in the assembly to accomplish alignment.

In the drawings and specification, there have been disclosed illustrated preferred embodiments of the invention, and although specific terms are employed, the terms are used in a descriptive sense only and not for purposes of limitation. The invention has been described in considerable detail with specific reference to these illustrated embodiments. It will be apparent, however, that various modifications and changes can be made within the spirit and scope of the invention as described in the foregoing specification and as defined in the appended claims.

That which is claimed:

1. An apparatus for use with data storage media and comprising:
    an integrated optical head comprising
        a first substrate being optically transparent and having opposing first and second faces,
        a light source positioned on the first face of said first substrate for emitting light through said first substrate and toward the data storage media,
        an optical detector on the first face of said first substrate for detecting light reflected from the data storage media and through said substrate,
        at least one first optical element on said first substrate and positioned in an optical path between said light source and said optical detector, and
    first passive alignment means for passively aligning said first substrate and at least one of either said light source or said optical detector, said first passive alignment means comprising a first plurality of contact pads on the first face of said first substrate, a second plurality of contact pads on at least one of said light source and said optical detector, and a plurality of solder bumps between said first and second plurality of contact pads to passively align said first substrate and at least one of said light source and said optical detector; and
    head positioning means for positioning said integrated optical head relative to the data storage media.

2. An apparatus according to claim 1 further comprising a plurality of electrical connections on the second face of said first substrate; and wherein at least one of said light source and said optical detector is electrically connected to said electrical connections on the first face of said first substrate via said plurality of solder bumps.

3. An apparatus according to claim 1 wherein said first passive alignment means comprises mechanical mating means between the first face of said first substrate and at least one of said light source and said optical detector.

4. An apparatus according to claim 3 wherein said mechanical mating means comprises a plurality of mating features defined between the first face of said first substrate and at least one of said light source and said optical detector.

5. An apparatus for use with data storage media and comprising:
    an integrated optical head comprising
        a first substrate being optically transparent and having opposing first and second faces,
        a light source positioned on the first face of said first substrate for emitting light through said first substrate and toward the data storage media,
        an optical detector on the first face of said first substrate for detecting light reflected from the data storage media and through said substrate,
        at least one first optical element on said first substrate and positioned in an optical path between said light source and said optical detector,
        first passive alignment means for passively aligning said first substrate and at least one of either said light source or said optical detector,
        a second substrate positioned adjacent said first substrate, said second substrate being optically transparent and having opposing first and second faces, and at least one second optical element on said second substrate in the optical path between said light source and said optical detector; and head positioning means for positioning said integrated optical head relative to the data storage media.

6. An apparatus according to claim 5 further comprising second passive alignment means for passively aligning said first substrate and said second substrate so that said at least one second optical element is aligned in the optical path between said light source and said optical detector.

7. An apparatus according to claim 6 wherein said second passive alignment means comprises:

a third plurality of contact pads on the second face of sand first substrate;

a fourth plurality of contact pads on the first face of said second substrate; and a plurality of solder bumps between said third and fourth plurality of contact pads to passively align said first substrate and said second substrate.

8. An apparatus according to claim 6 wherein said second passive alignment means comprises mechanical mating means between said second face of said first substrate and said first face of said second substrate.

9. An apparatus according to claim 8 wherein said mechanical mating means comprises a plurality of mechanically mating features.

10. An apparatus according to claim 5 wherein said at least one second optical element comprises:

a first refractive optical element positioned in the optical path between said light source and the data storage media, and a second refractive optical element positioned in the optical path between the data storage media and said optical detector.

11. An apparatus according to claim 5 wherein said at least one second optical element comprises a hybrid optical element including diffractive and refractive portions.

12. An apparatus for use with data storage media and comprising an integrated optical head comprising a first substrate being optically transparent and having opposing first and second faces, a light source positioned on the first face of said first substrate for emitting light through said first substrate and toward the data storage media, an optical detector on the first face of said first substrate for detecting light reflected from the data storage media and through said substrate, at least one first optical element on said first substrate and positioned in an optical path between said light source and said optical detector, said at least one first optical element comprising a hybrid optical element including diffractive and refractive portions, and first passive alignment means for passively aligning said first substrate and at least one of either said light source or said optical detector; and head positioning means for positioning said integrated optical head relative to the data storage media.

13. An apparatus for use with data storage media and comprising:

an integrated optical head comprising a first substrate being optically transparent and having opposing first and second faces, a light source positioned on the first face of said first substrate for emitting light through said first substrate and toward the data storage media, said light source comprising an edge emitting light source, an optical detector on the first face of said first substrate for detecting light reflected from the data storage media and through said substrate, at least one first optical element on said first substrate and positioned in an optical path between said light source and said optical detector, first passive alignment means for passively aligning said first substrate and at least one of either said light source said optical detector, and a mirror connected to the first face of said first substrate and in the optical path between said light source and said optical detector; and second passive alignment means for passively aligning said mirror and said first substrate; and head positioning means for positioning said integrated optical head relative to the data storage media.

14. An integrated optical head for use with data storage media, said integrated optical head comprising:

a first substrate being optically transparent and having opposing first and second faces;

a light source positioned on the first face of said first substrate for emitting light through said first substrate and toward the data storage media;

an optical detector on the first face of said first substrate for detecting light reflected from the data storage media and through said first substrate;

at least one first optical element on said first substrate and positioned in an optical path from said light source to said optical detector, said at least one first optical element comprising at least one of a diffractive optical element and a refractive optical element; and mechanical mating means between said first face of said first substrate and said light source and said optical detector for passively aligning said substrate and at least one of either said light source or said optical detector.

15. An integrated optical head for use with data storage media, said integrated optical head comprising:

a first substrate being optically transparent and having opposing first and second faces;

a light source positioned on the first face of said first substrate for emitting light through said first substrate and toward the data storage media;

an optical detector on the first face of said first substrate for detecting light reflected from the data storage media and through said first substrate;

at least one first optical element on said first substrate and positioned in an optical path from said light source to said optical detector, said at least one first optical element comprising a hybrid optical element including diffractive and refractive portions; and mechanical mating means between said first face of said first substrate and said light source and said optical detector for passively aligning said substrate and at least one of either said light source or said optical detector.

16. An integrated optical head for use with data storage media, said integrated optical head comprising:

a first substrate being optically transparent and having opposing first and second faces;

a first plurality of contact pads on the first face of said first substrate;

a light source positioned on the first face of said first substrate for emitting light through said first substrate and toward the data storage media;

an optical detector on the first face of said first substrate for detecting light reflected from the data storage media and through said first substrate;

a second plurality of contact pads on at least one of said light source and said optical detector;

at least one first optical element on said first substrate and positioned in an optical path between said light source and said optical detector; and a plurality of solder bumps between either said first or second plurality of contact pads for passively aligning said first substrate and at least one of said light source and said optical detector.

17. An integrated optical head according to claim 16 further comprising a plurality of electrical connections on the second face of said first substrate; and wherein at least one of said light source and said optical detector is electrically connected to said electrical connections on the first face of said first substrate via said plurality of solder bumps.

18. An integrated optical head according to claim 16 wherein said at least one first optical element comprises at least one of a diffractive optical element and a refractive optical element; and wherein said at least one first optical element is on at least one of the first face and the second face of said first substrate.

19. An integrated optical head according to claim 16 wherein said at least one first optical element comprises a hybrid optical element including diffractive and refractive portions.

20. An integrated optical head according to claim 16 further comprising:

a second substrate positioned adjacent said first substrate, said second substrate being optically transparent and having opposing first and second faces; and at least one second optical element on said second substrate.

21. An integrated optical head according to claim 20 further comprising passive alignment means for passively aligning said first substrate and said second substrate so that said at least one second optical element is aligned in the optical path between said light source and said optical detector.

22. An integrated optical head according to claim 20 wherein said at least one second optical element comprises:

a first refractive optical element positioned in the optical path from said light source toward said data storage media; and a second refractive optical element positioned in the optical path from the data storage media to said optical detector.

23. An integrated optical head according to claim 20 wherein said at least one second optical element comprises at least one of a diffractive optical element and a refractive optical element.

24. An integrated optical head according to claim 20 wherein said at least one second optical element comprises a hybrid optical element including diffractive and refractive portions.

25. An integrated optical head for use with data storage media, said integrated optical head comprising:

a first substrate being optically transparent and having opposing first and second faces;

a light source positioned on the first face of said first substrate for emitting light through said first substrate and toward the data storage media;

an optical detector on the first face of said first substrate for detecting light reflected from the data storage media and through said first substrate;

at least one first optical element on said first substrate and positioned in an optical path from said light source to said optical detector; and mechanical mating means between said first face of said first substrate and said light source and said optical detector for passively aligning said substrate and at least one of either said light source or said optical detector, said mechanical mating means comprising a plurality of mechanically mating features defined between the first surface of said first substrate and at least one of said light source and said optical detector.

26. An integrated optical head for use with data storage media, said integrated optical head comprising:

a first substrate being optically transparent and having opposing first and second faces;

a light source positioned on the first face of said first substrate for emitting light through said first substrate and toward the data storage media;

an optical detector on the first face of said first subtsrate for detecting light reflected from the data storage media and through said first substrate;

at least one first optical element on said first substrate and positioned in an optical path from said light source to said optical detector;

a second substrate positioned adjacent said first substrate, said second substrate being optically transparent and having opposing first and second faces;

at least one second optical element on said second substrate; and mechanical mating means between said first face of said first substrate and said light source and said optical detector for passively aligning said substrate and at least one of either said light source or said optical detector.

27. An integrated optical head according to claim 26 further comprising;

passive alignment means for passively aligning said first substrate and said second substrate so that said at least one second optical element is aligned in the optical path between said light source and said optical detector.

28. An integrated optical head according to claim 26 wherein said at least one second optical element comprises:

a first refractive optical element positioned in the optical path between said light source and data storage media; and a second refractive optical element positioned in the optical path between the data storage media and said optical detector.

29. An integrated optical head according to claim 26 wherein said at least one second optical element comprises at least one of a diffractive optical element and a refractive optical element.

30. An integrated optical head according to claim 26 wherein said at least one second optical element comprises a hybrid optical element including diffractive and refractive portions.

31. A method for making an integrated optical head for use with data storage media, the method comprising the steps of:

providing a first transparent substrate having opposing first and second faces;

forming at least one first optical element on the first transparent substrate;

positioning a light source and an optical detector on the first face of the first substrate for emitting light through said first substrate and toward the data storage media and detecting light reflected from the data storage media and through said substrate;

passively aligning the first substrate and at least one of either said light source or said optical detector;

providing a second transparent substrate comprising at least one second optical element; and passively aligning the second transparent substrate with the second surface of the first transparent substrate so that the at least one second optical element is positioned in an optical path between the light source and the optical detector.

32. A method according to claim 31 wherein the steps of providing the first and second transparent substrates comprises providing first and second transparent wafers; and wherein the step of passively aligning the first and second substrates comprises passively aligning the first and second wafers.

33. A method according to claim 32 further comprising the steps of securing the aligned first and second wafers together; and dicing the wafers into a plurality of integrated optical devices.

34. An article during the manufacture of a plurality of integrated optical heads, said article comprising:

a first wafer being optically transparent and having opposing first and second faces, and a plurality of light sources and optical detectors on a first face of said first wafer;

a second wafer being optically transparent and having opposing first and second faces, and a plurality of optical elements on said second wafer; and passive alignment means for passively aligning said first wafer and said second wafer so that said plurality of light sources and optical detectors are aligned with said plurality of optical elements.

35. An article according to claim 34 wherein said passive alignment means comprises:

a first plurality of contact pads on the second face of said first wafer;

a second plurality of contact pads on the first face of said second wafer; and a plurality of solder bumps between said first and second plurality of contact pads to passively align said first wafer and second wafers.

36. An article according to claim 34 wherein said passive alignment means comprises mechanical mating means between said second face of said first wafer and said first face of said second wafer.

37. An article according to claim 36 wherein said mechanical mating means comprises a plurality of mechanically mating features defined in the second surface of said first wafer and the first face of said second wafer.

38. An article according to claim 34 wherein aid passive alignment means comprises alignment indicia on said first wafer and said second wafer.

39. An article according to claim 34 further comprising an adhesive for securing said first and second wafers together.

40. An article according to claim 34 wherein said plurality of optical elements comprises diffractive optical elements.

41. An article according to claim 34 wherein said plurality of optical elements comprises refractive optical elements.

42. An article according to claim 34 wherein said plurality of optical elements comprises hybrid optical elements, each including diffractive and refractive portions.

43. A method for making an integrated optical head for use with data storage media, the method comprising the steps of:

providing a first transparent substrate having opposing first and second faces;

forming at least one first optical element on the first transparent substrate;

positioning a light source and an optical detector on the first face of the first substrate for emitting light through said first substrate and toward the data storage media and detecting light reflected from the data storage media and through said substrate; and passively aligning the first substrate and at least one of either said light source or said optical detector, the step of passively aligning comprising the steps forming a first plurality of contact pads on the first face of the first substrate, forming a second plurality of contact pads on at least one of either the light source or the optical detector, and forming a plurality of solder bumps between the first and second plurality of contact pads to passively align the first substrate and at least one of the light source and the optical detector.

44. A method according to claim 43 wherein the steps of forming the first and second pluralities of contact pads comprises forming the first and second pluralities of contact pads using forming same using photolithography.

45. An optical system comprising:

a first transparent substrate having alignment areas photolithographically placed on a first face and at least one diffractive optical element photolithographically formed in a second face, the photolithography of the first face being aligned with the photolithography of the second face;

at least one electronic device mounted to said first face by said alignment areas causing passive optical alignment between said electronic device and said diffractive optical element;

substrate alignment areas on the second face of said first transparent substrate; and a second transparent substrate having mating substrate attachment areas on a first face for attaching said first transparent substrate in alignment with said second transparent substrate.

46. An optical system according to claim 45 wherein said substrate attachment areas further comprises photolithographically placed metalization pads and solder balls.

47. An optical system according to claim 45 wherein said first transparent substrate is part of a first wafer and said second transparent substrate is part of a second wafer, said first transparent substrate and said second transparent substrate having been aligned by alignment of fiducial marks on said first wafer with fiducial marks on said second wafer respectively, said wafers having been attached to each other by said attachment areas prior to being diced into separate assemblies.

48. An optical system according to claim 45 further comprising refractive optical elements on a face of said second transparent substrate.

49. An optical system according to claim 45 wherein said system is a media reader and said at least one electronic device further comprises:

a light source light source; and a plurality of light detectors.

50. An optical system according to claim 49 wherein said at least one diffractive optical element which divides the light from said light source into a plurality of beams for reflection from said media, each reflected beam having an individual refractive lens on the first surface of said second transparent substrate for transmitting said reflected beam to a detector.

51. An optical system according to claim 45 further comprising:
 a light source light source mounted to the first face of said first transparent substrate by said alignment areas, said diffractive optical element divides light from said light source into a plurality of beams for refection from a media;
 a detector device having a plurality of light sensitive areas, said detector being mounted to the first face of said first transparent substrate by said alignment areas; and
 a plurality of refractive optical elements on the first surface of said second transparent substrate, each reflected beam passing through an individual refractive lens on the first surface of said second transparent substrate for transmitting said reflected beam to one of said light sensitive areas of said detector.

52. An integrated optical system comprising:
 a first transparent substrate having a light source and a light detector on a first face and at least on alignment area on a second face;
 a second transparent substrate mounted to the second face, the mounting including a mating alignment area on the second transparent substrate for mating with the alignment area and causing passive optical alignment between the first transparent substrate and the second transparent substrate;
 a holographic optical element formed in the second face of the first transparent substrate for directing light from the light source to a remote target; and
 a refractive lens formed in a first face of the second transparent substrate for directing light from the light source received through the first holographic optical element to the remote target.

53. An integrated optical system according to claim 52 further comprising:
 a second refractive lens formed in the first face of said second transparent substrate for directing light from the remote target to the detector.

54. An integrated optical system according to claim 53 further comprising a third refractive lens formed in the first face of said second transparent substrate for directing light from the remote target to a light intensity detector.

55. An integrated optical system according to claim 52 wherein said first and second substrates comprise fused silica.

56. An integrated optical system according to claim 52 wherein:
 the alignment area further comprises a metalized area of predetermined size and position;
 the mating alignment area further comprises a metalized area of predetermined size and position; and
 the mounting further comprising solder of predetermined volume and liquified surface tension for passively pulling the first transparent substrate and the second transparent substrate into horizontal alignment and maintaining the second substrate a predetermined distance from the first transparent substrate.

57. An integrated optical system according to claim 52 wherein:
 the alignment area further comprises an alignment bench of predetermined height and position;
 the mating alignment area further comprises an alignment recess of predetermined depth and position; and
 the mounting further comprising adhesive, the bench and the recess interacting to maintain the first transparent substrate and the second transparent substrate in horizontal alignment and to maintaining the second substrate a predetermined distance from the first transparent substrate.

58. An integrated optical system according to claim 52 wherein the light source further comprises a semiconductor light source adjacent to an angled mirror, the light source and the mirror mounted and aligned with each other and aligned with the holographic optical element by flip chip solder bonds.

59. An integrated optical system according to claim 52 wherein the holographic optical element formed in the second face of the first transparent substrate further comprises:
 a metal layer defining an aperture and a binary grating surrounding the aperture for dispersing stray light; and
 a diffractive optical element located within the aperture for directing light from the light source to the remote target.

60. An apparatus for use with data storage media and comprising:
 an integrated optical head comprising
  a first substrate being optically transparent and having opposing first and second faces,
  a light source positioned on the first face of said first substrate for emitting light through said first substrate and toward the data storage media,
  an optical detector on the first face of said first substrate for detecting light reflected from the data Storage media and through said substrate,
  at least one first optical element on said first substrate and positioned in an optical path between said light source and said optical detector, and
  first passive alignment means for passively aligning said first substrate and at least one of either said light source or said optical detector, said first passive alignment means comprising mechanical mating means between the first face of said first substrate and at least one of said light source and said optical detector; and
 head positioning means for positioning said integrated optical head relative to the data storage media.

61. An apparatus according to claim 60 wherein said mechanical mating means comprises a plurality of features defined between the first face of said first substrate and at least one of said light source and said optical detector.

62. An apparatus for use with data storage media and comprising:
 an integrated optical head comprising
  a first substrate being optically transparent and having opposing first and second faces,
  a light source positioned on the first face of said first substrate for emitting light through said first substrate and toward the data storage media,
  an optical detector on the first face of said first substrate for detecting light reflected from the data storage media and through said substrate,
  at least one first optical element on said first substrate and positioned in an optical path between said light source and said optical detector, said at least one first optical element comprising at least one of a diffractive optical element and a refractive optical element, said at least one first optical element being positioned on at least one of the first face and the second face of said first substrate, and first passive alignment means for passively aligning said first substrate and at least one of either said light source or said optical detector; and head positioning means for positioning said integrated optical head relative to the data storage media.

63. A method for making an integrated optical head for use with data storage media, the method comprising the steps of:

providing a first transparent substrate having opposing first and second faces;

forming at least one first optical element on the first transparent substrate;

positioning a light source and an optical detector on the first face of the first substrate for emitting light through said first substrate and toward the data storage media and detecting light reflected from the data storage media and through said substrate; and passively aligning the first substrate and at least one of either said light source or said optical detector, the passively aligning step comprising the step of forming mechanically mating features between the first surface of the substrate and at least one of the light source and the optical detector, and relatively positioning the first substrate and at least one of the light source and the optical detector so that the mechanically mating features engage one another.

64. An integrated optical system comprising:

a transparent substrate having alignment areas photolithographically placed on a first face and at least one hybrid optical element photolithographically formed in a second face, the photolithography of the first face being aligned with the photolithography of the second face, the hybrid optical element comprising a metal layer defining an aperture, a binary grating surrounding the aperture for dispersing stray light, and a diffractive optical element located within the aperture for directing light from a light source in the electronic device to a media; and at least one electronic device mounted to said first face by said alignment areas causing passive optical alignment between said electronic device and said hybrid optical element.

* * * * *